United States Patent

[11] 3,588,747

[72] Inventor Frank W. Rusho
Liverpool, N.Y.
[21] Appl. No. 768,003
[22] Filed Oct. 16, 1968
[45] Patented June 28, 1971
[73] Assignee General Electric Company

[54] WIDEBAND COMPOSITE FREQUENCY MODULATOR
4 Claims, 2 Drawing Figs.

[52] U.S. Cl. .......... 332/26,
325/139, 325/148, 331/23, 331/36, 332/30
[51] Int. Cl. .......... H03c 3/28
[50] Field of Search .......... 332/1, 16, 16 (T), 22, 23, 26, 30, 30 (V); 325/139, 145, 148; 331/36 (C), 23

[56] References Cited

UNITED STATES PATENTS

| | | | |
|---|---|---|---|
| 2,358,152 | 9/1944 | Earp | 332/22X |
| 2,852,746 | 9/1958 | Scheele | 332/16(T) |
| 3,046,496 | 7/1962 | Trevor | 331/23X |
| 3,105,205 | 9/1963 | Weidknecht et al. | 332/30(V) |
| 3,110,863 | 11/1963 | Weidknecht et al. | 332/26X |
| 3,256,498 | 6/1966 | Hurtig | 332/30(V) |
| 3,328,727 | 6/1967 | Lynk | 332/30(V) |
| 3,243,730 | 3/1966 | Anderson | 332/23X |

*Primary Examiner*—Alfred L. Brody
*Attorneys*—Norman C. Fulmer, Carl W. Baker, Frank L. Neuhauser, Oscar B. Waddell and Melvin M. Goldenberg

ABSTRACT: A wideband composite frequency modulation system is disclosed, in which a crystal oscillator is frequency modulated primarily by the lower frequency range of the modulation signal and the resulting signal is phase modulated primarily by the higher frequency range of the modulation signal, resulting in wideband frequency modulation of a crystal-controlled carrier signal.

INVENTOR:
FRANK W. RUSHO,

BY Norman C. Fulmer
HIS ATTORNEY.

WIDEBAND COMPOSITE FREQUENCY MODULATOR

BACKGROUND OF THE INVENTION

The invention is in the field of signal modulation by means of electronic circuits, and more specifically relates to frequency modulation of a crystal-controlled carrier signal such as is useful for telemetry and other purposes.

Certain frequency modulation systems, such as telemetry systems for rocket guidance and control, require the use of a crystal-controlled oscillator in order to achieve desired frequency stability of the carrier signal. A voltage controlled crystal oscillator can be frequency modulated over a limited range of frequencies. For example, a 23 mc. voltage controlled crystal oscillator can be frequency modulated satisfactorily over a frequency range of zero to approximately 200 Kc. The upper limit of frequency modulation is limited by spurious oscillation modes in the quartz crystal and also by the high motional inductance of the crystal which causes the loop gain of the oscillator circuit to become less than unity at a certain frequency thus contributing to the upper limit of modulation frequency. Therefore the amount of information to be transmitted must be limited to fit the frequency modulation bandwidth attainable, or more complicated circuitry must be employed, such as two or more oscillators and modulators, in order to transmit the desired amount of information.

SUMMARY OF THE INVENTION

Objects of the invention are to provide an improved frequency modulation system, to achieve wideband frequency modulation of a crystal-controlled carrier wave, and to achieve the foregoing objectives with compact, reliable, and inexpensive circuitry.

The invention comprises, briefly and in a preferred embodiment, a crystal oscillator frequency modulated primarily by the lower frequency range of a modulation signal, followed by a phase modulator which is modulated primarily by the higher frequency range of the modulation signal. In accordance with an important feature of the invention, the modulation signal is fed through a low-pass filter, which may comprise a resistance-capacitance integration network, and the signal output of the low-pass filter is utilized for both of the aforesaid frequency modulation and phase modulation. The low-pass filter preferably is designed so that its corner frequency is the same as the frequency at which the gain of the phase modulator equals the gain of the modulated oscillator. The overall result is wideband frequency modulation of a crystal-controlled carrier signal in accordance with the objects of the invention.

DESCRIPTION OF THE PREFERRED EMBODIMENT

Figure 1:
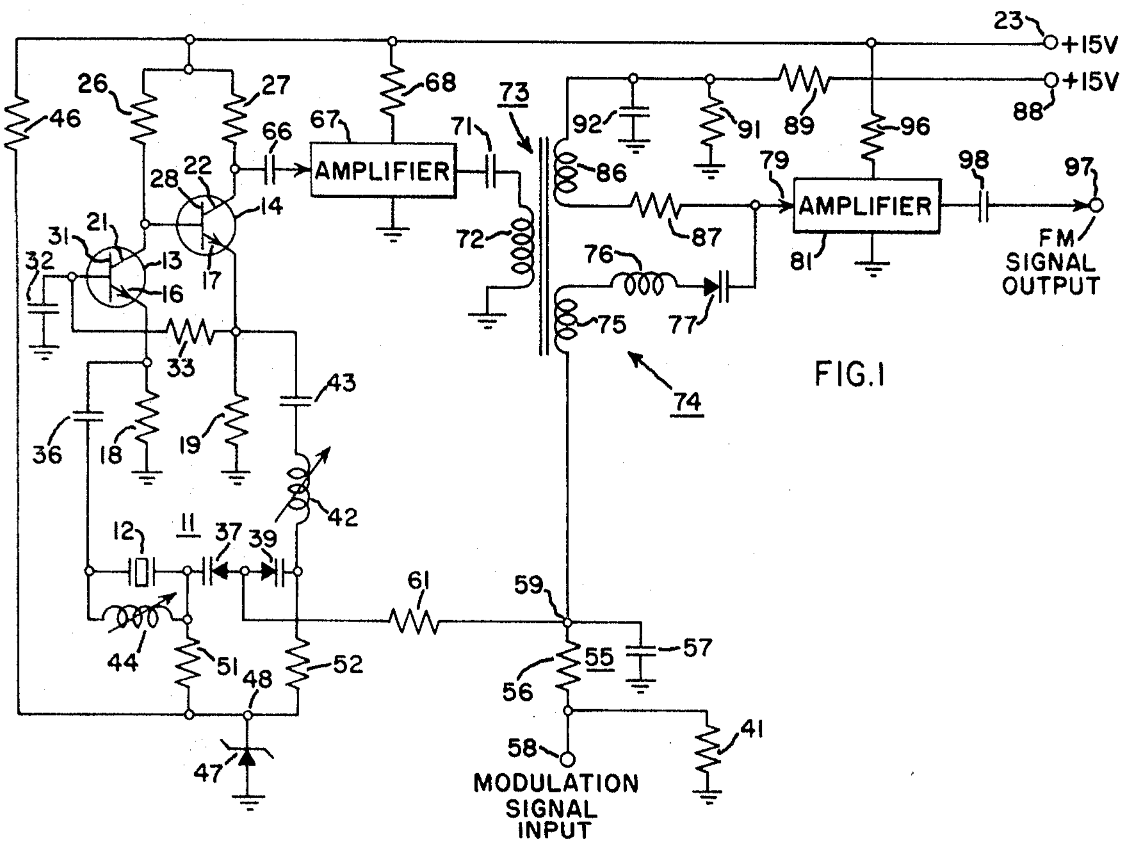
FIG. 1 is an electrical schematic diagram of a preferred embodiment of the invention.

In FIG. 1, a frequency modulated crystal-controlled oscillator designated generally by the numeral 11 of conventional design and operating at 23 mc. for example, comprises a quartz crystal 12, a two-stage amplifier employing transistors 13 and 14, and additional components as will now be described. The emitter electrodes 16 and 17 of the transistors 13 and 14 are respectively connected to electrical ground through resistors 18 and 19. Collector electrodes 21 and 22 of the transistors 13 and 14 are respectively connected to a terminal 23 for positive polarity DC operating voltage, through resistors 26 and 27, and the collector 21 also is connected to the base electrode 28 of the transistor 14. The base electrode 31 of transistor 13 is connected to electrical ground via a capacitor 32, and also is connected to the emitter electrode 17 by a resistor 33. Connected in series between the emitter 16 of transistor 13 and the emitter 17 of the transistor 14, as shown, are a capacitor 36, the crystal 12, first and second variable-capacitance diodes (varactors) 37 and 39 connected back-to-back, an adjustable inductor 42, and a capacitor 43. An adjustable inductor 44 is connected across the crystal 12. A resistor 46 and Zener diode 47 are connected in series, as shown, between the DC voltage terminal 23 and electrical ground, to provide a stabilized voltage at their junction 48. A resistor 51 is connected between the junction 48 and the junction of the crystal 12 and varactor 37, and another resistor 52 is connected between the junction 48 and the junction of the varactor 39 and adjustable inductor 42.

A resistor 56 and capacitor 57 are connected in series between a modulation signal input terminal 58 and electrical ground. A resistor 41 is connected from input terminal 58 and electrical ground. The resistor 56 and capacitor 57 form an integration network, as will be described more fully, which provides an integrated modulation signal at the junction 59 thereof. A resistor 61 is connected between the junction 59 and the junction of the varactors 37 and 39.

The signal output from the oscillator 11, which is taken from the collector electrode 22 of transistor 14, is coupled via a capacitor 66 to the input of amplifier 67 to which operating DC current is applied via a resistor 68. The amplified output signal from the amplifier 67 is coupled via a capacitor 71 to an end of the primary winding 72 of a phase modulation transformer 73, in a phase modulation circuit 74 of conventional design the remaining end of the primary winding 72 being electrically grounded. A first secondary winding 75 of the phase modulation transformer 73 is connected at an end thereof to the junction 59 of the integration resistor 56 and capacitor 57, and the other end of secondary winding 75 is connected, via a series arrangement of an inductor 76 and a varactor 77, to the input 79 of an amplifier 81. A second secondary winding 86 of the phase modulation transformer 73 has one end thereof connected to the input 79 of amplifier 81 via a resistor 87, the remaining end of secondary winding 86 being connected to a terminal 88 of positive polarity DC operating voltage via a resistor 89. A resistor 91 and capacitor 92 are connected between electrical ground and the last-mentioned end of the secondary winding 86. DC operating current is applied to the amplifier 81 via a resistor 96, and the amplified signal output of the amplifier 81 is connected to a frequency modulated signal output terminal 97 via a coupling capacitor 98.

A well-known and often undesirable characteristic of phase modulators such as the phase modulator 74 shown in FIG. 1 when used to obtain frequency modulation, is that the deviation (modulation gain) increases with frequency at a rate of 20 db. per frequency decade. The present invention utilizes this characteristic advantageously as will be described subsequently. The invention provides wideband frequency modulation of a crystal-controlled carrier, at the signal output terminal 97, by means of feeding the modulation signal input at terminal 58 through the low-pass filter or integration network comprising resistor 56 and 57, and applying the integrated signal output thereof to the crystal oscillator 11 and also to the phase modulation transformer 73, the electrical design of the low-pass filter network 56—57 being such that primarily the lower range of modulation frequency effects the frequency modulation of the oscillator 11 and primarily the higher frequency range of the modulation signal effects the phase modulation of the frequency modulated oscillator signal at the phase modulation transformer 73, resulting in the aforesaid overall wideband frequency modulation signal at the output terminal 97, having a modulation frequency bandwidth extending to or beyond 1 megacycle in frequency for a carrier frequency of 23 mc.

Figure 2:
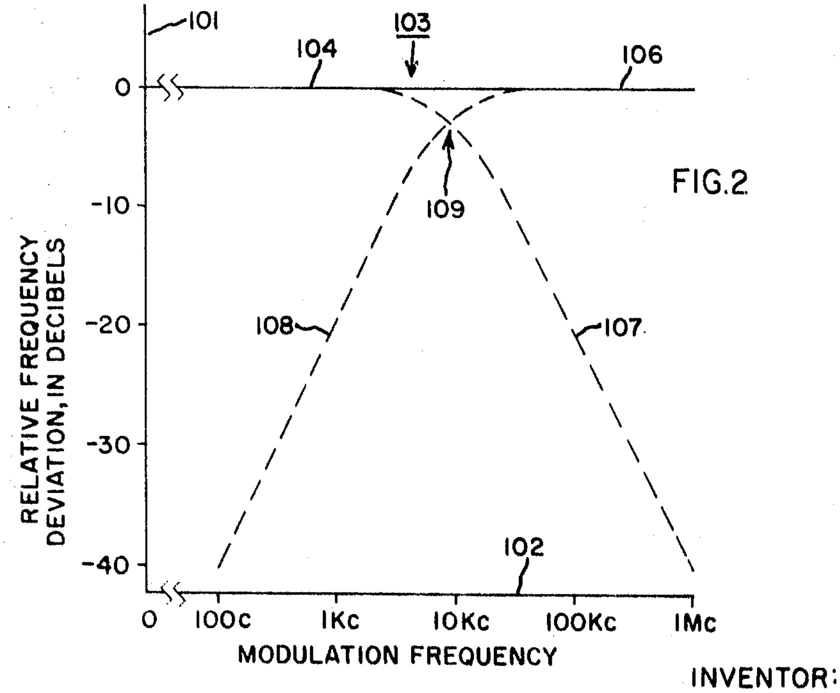
FIG. 2 is a graph of modulation gain or frequency deviation versus frequency, for illustrating the operation of the invention.

The aforesaid operation of the invention will be more fully understood with reference to FIG. 2, in which the vertical axis 101 represents relative frequency deviation in decibels and the horizontal axis 102 represents the modulation signal frequency on a logarithmic scale. The overall composite wideband frequency modulation response is represented by the solid line 103 extending, at the 0 db. level, from 0 modulation frequency to over 1 megacycle per sec. The lower frequency range of this response, for example below 10 Kc., is indicated by numeral 104 and the upper frequency range, for example above 10 Kc., is indicated by numeral 106. The frequency modulation characteristic of the crystal oscillator 11 is shown by the dashed-line curve 107 which merges coextensively with the lower frequency range 104 of the composite modulation characteristic 103, and the effective frequency modulation of the phase modulator 74 is shown by the dashed-line curve 108 which merges coextensively with the upper frequency range 106 of the composite modulation characteristic 103. The curves 107 and 108 have slopes of 20 db. per frequency decade, and cross each other at a point 109 that is 3 db. down from the composite response 103. The low-pass filter 55 is designed so that its characteristic curve of gain versus modulation frequency coincides with the curve 107, the ordinate 101 also representing signal gain for this purpose, and the so-called corner frequency of the filter 55 characteristic curve being at the point 109 which is 3 db. down from the maximum gain. The 3 db. down crossover of the curves 107 and 108 insures a smooth transition of the overall response curve 103 between its lower and upper frequency ranges 104 and 106.

For the sake of clarity, it is mentioned at this point that the voltage controlled crystal oscillator circuit 11, which is a well-known standard frequency modulation oscillator circuit, has an effective modulation gain characteristic which is substantially constant and useable up to a certain frequency which, in the example shown, is a frequency greater than 10 Kc. The phase modulation circuit 74 of which the phase modulation transformer 73 is the principal component, has a characteristic of modulation frequency deviation gain versus modulation signal frequency which increases with modulation signal frequency at a rate of 20 db. per frequency decade as shown in part by the dashed line 108 in FIG. 2. The low-pass filter 55 is designed so that its corner frequency at 109 is the same as the frequency at which the modulation gain of the phase modulator, represented by curve 108 in FIG. 2, equals the modulation gain of the oscillator 11. Thus, as can be seen from FIG. 2, the lower range of modulation frequencies, i.e. below 10 Kc. in the example shown, are fully effective for frequency modulating the crystal-controlled oscillator 11, but are relatively little effective in modulating the phase modulator 74 due to its lower modulation gain indicated by the curve 108 in the lower frequency range of the modulation signal. In the modulation signal frequency range above 10 Kc., in the example shown, the phase modulation achieved at the phase modulator 74 is substantially constant in gain and at the same gain level as that of the frequency modulated oscillator 11, since 20 db. per frequency decade increase in phase modulator gain is offset by the 20 db. per frequency decade decrease in modulation signal effected by the low-pass filter 55. Since the modulation signal in the upper frequency range is being integrated, frequency modulation is actually achieved in the phase modulator 74, instead of phase modulation, resulting in an overall frequency modulation of wide signal bandwidth, as indicated by the response characteristic 103 achieved with reliable, compact, and low cost circuitry in accordance with the objects of the invention. In addition, the capacitor 57 of the low-pass filter 55 functions as a radio frequency bypass capacitor for both the crystal oscillator 11 and the phase modulator 74, thus keeping the radio frequency components from passing through the terminal 58 into the modulation signal source.

While a preferred embodiment of the invention has been shown and described, various other embodiments and modifications thereof will become apparent to persons skilled in the art, and will fall within the scope of invention as defined in the following claims.

I claim:

1. A frequency modulation system wherein the improvement comprises, in combination, a modulation signal terminal for input of a modulation signal having a given frequency bandwidth, an oscillator capable of being frequency modulated at a given value of modulation gain over at least the lower frequency range of said modulation signal, a phase modulator having the characteristic of increasing modulation gain with increasing modulation frequency, means for applying the frequency modulated oscillator signal to said phase modulator, and low-pass filter means connected between said modulation signal terminal and said oscillator for applying thereto primarily a relative low frequency range of said modulation signal and connected to said phase modulator to apply said modulation signal to said phase modulator to achieve phase modulation of said frequency modulated oscillator signal at approximately said given value of modulation gain over a relatively high frequency range of said modulation signal.

2. A frequency modulation system wherein the improvement comprises, in combination, a voltage controlled crystal oscillator, a modulation signal terminal for input of a modulation signal having a given frequency bandwidth, said oscillator being capable of being frequency modulated at a given modulation gain over at least the lower frequency range of said modulation signal, a phase modulator connected to receive the output signal of said oscillator and having the characteristic of increasing modulation gain with increasing modulation frequency, the value of said increasing modulation gain becoming at least equal to said given modulation gain of the oscillator at a given frequency within said frequency bandwidth of the modulation signal, a low-pass filter connected to said modulation signal terminal, and means connecting the output of said low-pass filter to said oscillator for frequency modulation of the oscillator signal and to said phase modulator for phase modulation of the frequency modulated oscillator signal, said low-pass filter having a signal-passing versus frequency characteristic curve which has a corner frequency equal to said frequency at which the phase modulation gain is equal to the oscillator frequency modulation gain.

3. A frequency modulation system as claimed in claim 2, in which said low-pass filter comprises a resistance-capacitance integration network having a resistor connected in series with the modulation signal followed by a capacitor connected in shunt with the modulation signal.

4. A frequency modulation system as claimed in claim 3, in which said modulation gain of the phase modulator increases a given amount per frequency decade, and in which said integration network is designed to have a fall-off slope of approximately said given amount per frequency decade.